US009269682B2

(12) United States Patent
Yu et al.

(10) Patent No.: US 9,269,682 B2
(45) Date of Patent: Feb. 23, 2016

(54) METHOD OF FORMING BUMP STRUCTURE

(71) Applicant: Taiwan Semiconductor Manufacturing Company, Ltd., Hsin-Chu (TW)

(72) Inventors: Tsung-Yuan Yu, Taipei (TW); Hsien-Wei Chen, Hsin-Chu (TW); Ying-Ju Chen, Tuku Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/778,969

(22) Filed: Feb. 27, 2013

(65) Prior Publication Data

US 2014/0242791 A1 Aug. 28, 2014

(51) Int. Cl.
*H01L 23/00* (2006.01)

(52) U.S. Cl.
CPC ................ *H01L 24/11* (2013.01); *H01L 24/03* (2013.01); *H01L 24/05* (2013.01); *H01L 24/13* (2013.01); *H01L 2224/0345* (2013.01); *H01L 2224/0348* (2013.01); *H01L 2224/0391* (2013.01); *H01L 2224/03424* (2013.01); *H01L 2224/03462* (2013.01); *H01L 2224/03464* (2013.01); *H01L 2224/0401* (2013.01); *H01L 2224/05022* (2013.01); *H01L 2224/05026* (2013.01); *H01L 2224/05027* (2013.01); *H01L 2224/05109* (2013.01); *H01L 2224/05111* (2013.01); *H01L 2224/05139* (2013.01); *H01L 2224/05144* (2013.01); *H01L 2224/05155* (2013.01); *H01L 2224/05164* (2013.01); *H01L 2224/05166* (2013.01); *H01L 2224/05572* (2013.01); *H01L 2224/05573* (2013.01); *H01L 2224/05582* (2013.01); *H01L 2224/05583* (2013.01); *H01L 2224/05609* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05681* (2013.01); *H01L 2224/05687* (2013.01); *H01L 2224/11334* (2013.01); *H01L 2224/13022* (2013.01); *H01L 2224/13111* (2013.01); *H01L 2224/13113* (2013.01); *H01L 2224/13116* (2013.01); *H01L 2224/81191* (2013.01); *H01L 2224/94* (2013.01); *H01L 2224/97* (2013.01); *H01L 2924/15788* (2013.01)

(58) Field of Classification Search
CPC ......... H01L 24/03; H01L 24/05; H01L 24/02; H01L 24/12; H01L 24/11
USPC .................................................. 438/612–614
See application file for complete search history.

(56) References Cited

U.S. PATENT DOCUMENTS

| | | | | |
|---|---|---|---|---|
| 2006/0267198 | A1* | 11/2006 | Lin et al. | 257/750 |
| 2011/0049705 | A1* | 3/2011 | Liu et al. | 257/737 |
| 2011/0186995 | A1* | 8/2011 | Alvarado et al. | 257/737 |
| 2012/0326298 | A1* | 12/2012 | Lu et al. | 257/737 |

* cited by examiner

*Primary Examiner* — Thanhha Pham
(74) *Attorney, Agent, or Firm* — Slater & Matsil, L.L.P.

(57) ABSTRACT

A method of forming a bump structure includes forming a metallization layer on a top metal layer by electroless plating process, forming a polymer layer over the metallization layer; forming an opening on the polymer layer to expose the metallization layer, and forming a solder bump over the exposed metallization layer to make electrical contact with the top metal layer.

19 Claims, 4 Drawing Sheets

30
28
20
18
26
24
16
10
12

METHOD OF FORMING BUMP STRUCTURE

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, pads are formed and exposed on the surface of the respective chip. Electrical connections are made through pads to connect the chip to a package substrate or another die. Pads can be used for wire bonding or flip-chip bonding. Flip-chip packaging utilizes bumps to establish electrical contact between a chip's input/output (I/O) pads and the substrate or lead frame of the package. Structurally, a bump actually contains the bump itself and an "under bump metallurgy" (UBM) located between the bump and an I/O pad. Another structure used in flip chip technology is a direct bump on copper (DBOC) structure, in which the UBM is in direct contact with the copper metal of the top metallization layer. No aluminum pad or inner passivation layer is used in the DBOC structure. Without an aluminum pad or an inner passivation layer to act as a buffer, a DBOC structure generally has less mechanical strength and suffers from copper oxidation problems.

DETAILED DESCRIPTION

Figure 1A:
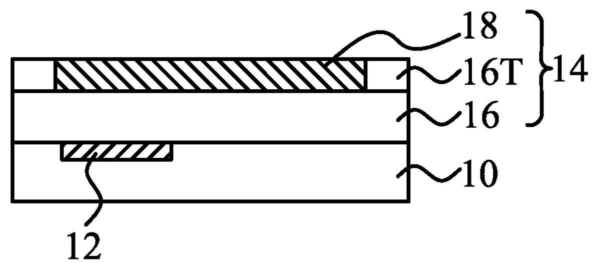
FIGS. 1A to 1E are cross-sectional views a method of forming a bump structure according to an embodiment.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 1A to 1E are cross-sectional views illustrating at various intermediate stages of forming a bump structure according to an embodiment.

Referring to FIG. 1A, a portion of a substrate 10 having electrical circuitry 12 formed thereon is shown in accordance with an embodiment. The substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used. The electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

FIG. 1A also depicts an interconnect structure 14 including a plurality of dielectric layers 16 and associated metallization layers (not shown) formed over the substrate 10. At least one of the dielectric layers 16 may include, for example, a low dielectric constant (low-k) material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). Metal lines or metal vias of the metallization layer formed in the dielectric layers 16 are used to interconnect the electrical circuitry 12 to each other and to provide an external electrical connection. The metallization layers may be formed of copper or copper alloys, although they can also be formed of other metals. One skilled in the art will realize the formation details of the metallization layers. Further, the metallization layers include a top metal layer 18 formed and patterned in or on the uppermost dielectric layer 16T to provide external electrical connections and to protect the underlying layers from various environmental contaminants. The uppermost dielectric layer 16T may be formed of a dielectric material, such as silicon nitride, silicon oxide, undoped silicon glass, and the like according to some embodiment. In some embodiments, the top metal layer 18 is formed of copper or copper alloys, which is a portion of conductive routs and has an exposed surface treated by a planarization process, such as chemical mechanical polishing (CMP), if necessary. In an embodiment, the top metal layer 18 is a pad region, on which a bump structure will be formed to connect the integrated circuits in the substrate 10 to external features.

Figure 1B:
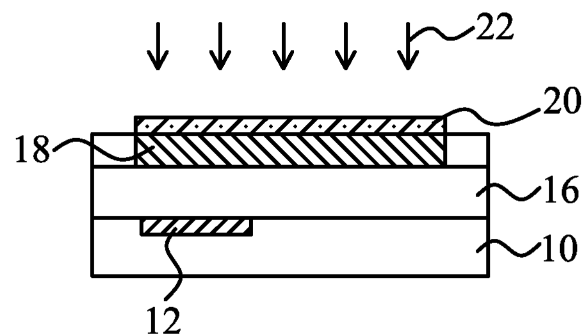

Referring to FIG. 1B, a first metallization layer 20 is formed to cap the pad region 18 in a self-aligned manner. In an embodiment, an electroless plating process 22 is employed to deposit a metal layer on the exposed portion of the pad region 18. The first metallization layer 20 may have a single-layer structure or a composite structure including a plurality of sub-layers formed of different materials, and may comprise a layer(s) selected from the group consisting essentially of nickel (Ni), titanium (Ti), tin (Sn), tin-lead (SnPb), gold (Au), silver, palladium (Pd), indium (In), nickel-palladium-gold (NiPdAu), nickel-gold (NiAu), a Ni-based alloy, an Au-based alloy, or a Pd-based alloy, other similar materials, or an alloy by an electroless plating process or an immersion plating process. In some embodiments, the first metallization layer 20 has a thickness about 0.2-3.0 μm, for example 0.3~0.5 μm. In one embodiment, the metal capping layer 20 is a triple-layer structure including an electroless Ni layer, an electroless Pd layer, and an immersion Au layer, which is also known as an ENEPIG structure. In one embodiment, the first metallization layer 20 is a dual-layer structure including an electroless Ni layer and an electroless Pd layer, named an ENEP structure. In one embodiment, the metal capping layer 20 is a single-layer structure including an electroless Ni layer, an immersion Sn layer, or an electroless Ti layer. The first metallization layer 20 is also referred to as a self-aligned under-bump metallization (UBM) layer formed on the pad region 18 directly. The first metallization layer 20 can prevent copper in the pad region 18 from oxidation and/or diffusing into bonding material. The prevention of copper oxidation and/or diffusion increases the reliability and bonding strength of the package.

Figure 1C:
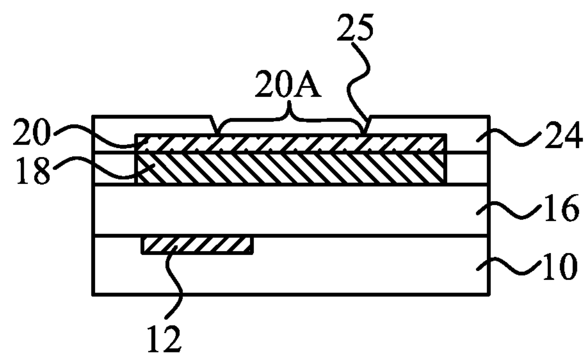

Next, as shown in FIG. 1C, one or more passivation layers, such as passivation layer 24, are formed over the resulted structure. The passivation layer 24 is patterned to form an opening 25 exposing a portion 20A of the first metallization layer 20. The passivation layer 24 may be formed of a dielectric material, such as undoped silicate glass (USG), silicon nitride, silicon oxide, silicon oxynitride or a non-porous material by any suitable method, such as CVD, PVD, or the like. In an embodiment, the passivation layer 24 is formed to cover the peripheral portion of the first metallization layer 20, and to expose the central portion of first metallization layer 20 through the opening 25 in passivation layer 24. The passivation layer 24 may be a single layer or a laminated layer.

Figure 1D:
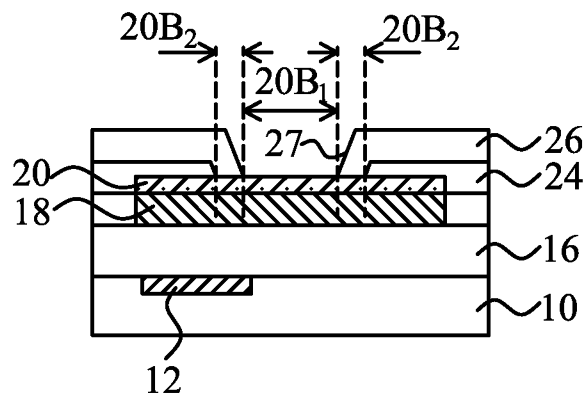

Next, as shown in FIG. 1D, a protective layer 26 is then formed on the passivation layer 24 and the exposed first metallization layer 20. Using photolithography and/or etching processes, the protective layer 26 is further patterned to form an opening 27 exposing the first metallization layer 20. In some embodiments, the exposed portion 20A includes a first portion $20B_1$ and a second portion $20B_2$. The first portion $20B_1$ may be the central portion of the exposed portion 20A, and the second portion $20B_2$ may be the peripheral portion of the exposed portion 20A. In some embodiments, the opening 27 of the protective layer 26 exposes the first portion $20B_1$ and covers the second portion $20B_2$, such that the protective layer 26 lands on the first metallization layer 20. In some embodiments, the protective layer 26 is formed of a polymer layer, such as an epoxy, polyimide, benzocyclobutene (BCB), polybenzoxazole (PBO), and the like, although other relatively soft, often organic, dielectric materials may also be used. The protective layer 26 lands on the metal capping layer and serves as a stress buffer layer according to some embodiments.

Figure 1E:
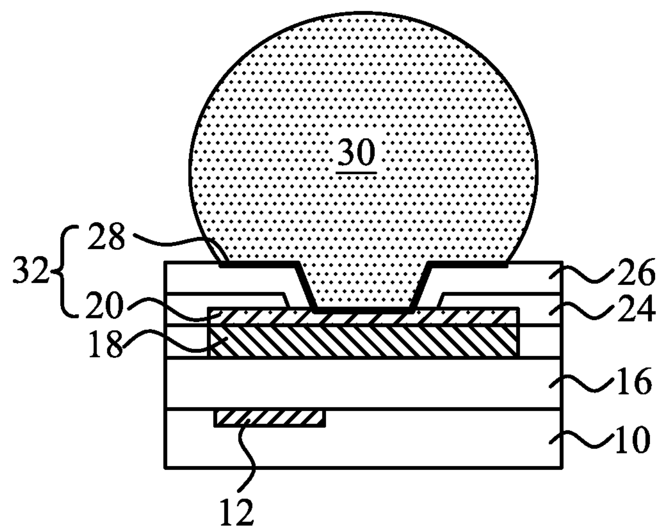

With reference to FIG. 1E, a second metallization layer 28 and a solder bump 30 are successively formed on the resulted structure to make an electrical contact with the first metallization layer 20 and the pad region 18. The second metallization layer 28 is an optional layer, which may include titanium, titanium nitride, tantalum, tantalum nitride, copper, copper alloy, nickel, silver, gold, aluminum, and combinations thereof may also be included and combinations thereof, and can be formed using physical vapor deposition, electroplating, sputtering, and the like. The second metallization layer 28 helps to improve the adhesion of the subsequently formed solder bump and package reliability. In some embodiments, the second metallization layer 28 is a dual-layered structure including a Ti layer and a Cu layer, in which the Ti layer has a thickness between about 0.01 μm to 0.1 μm and the Cu layer has a thickness between about 0.1 μm to 0.5 μm. In some embodiments, the second metallization layer 28 is a triple-layered structure including a Ti layer, a Cu layer and a Ni layer in which the Ti layer has a thickness between about 0.01 μm to 0.1 μm, the Cu layer has a thickness between about 0.1 μm to 0.5 μm, and the Ni layer has a thickness between about 0.1 μm to 0.5 μm. The fabrication of second metallization layer 28 includes depositing one or more metal layers and patterning the metal layers using the solder bump 30 as a mask. Thus the second metallization layer 28 is formed underneath the solder bump 30 along sidewalls and bottom of the opening 27 of the protective layer 26 and extends to the top surface of the protective layer 28. The solder bump 30 is formed on the second metallization layer 28 by plating or ball drop process. The solder bump 30 may include a lead-free pre-solder layer, SnAg, or a solder material including alloys of tin, lead, silver, copper, nickel, bismuth, or combinations thereof.

A bump structure including the first metallization layer 20, the second metallization layer 28 and the solder bump 30 are completed on the pad region 18. In the bump structure, the first metallization layer 20 and the second metallization layer 28 forms an UBM structure 32 under the solder bump 30. In the UBM structure 32, the first metallization layer 20 is a self-aligned UBM layer, and the second metallization layer 28 is an optional UBM layer. After the bump formation, for example, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

The presented embodiments provide the first metallization layer 20 as a self-aligned metal capping layer to prevent copper oxidation from the pad region 18 during transportation. The first metallization layer 20 formed on the pad region 18 by electroless plating process in a self-aligned manner. This also simplifies the bump-formation process to reduce the process costs significantly. The presented embodiments provide the first metallization layer 20 as a self-aligned UBM layer, and provide the protective layer 26 as a stress buffer layer landing on the self-aligned UBM layer, such that bump stress can be effectively released, bump reliability margin can be increased, and a robust bump scheme with improved electromigration (EM) lifetime may be achieved. Therefore, bump cracks can be reduced and low-k dielectric delamination may be eliminated in accordance with some embodiments. It has been found that the bump structure with the self-aligned UBM layer on the pad region performs comparable with respect to released bump stress, and the low-k dielectric layer located under the polymer layer can have 30% reduction in stress. Accordingly in packaging assembly processes, joint reliability can be increased and bump fatigue can be reduced.

The presented embodiments of forming the first metallization layer 20 after the formation of the pad region 18 are shown in FIGS. 1A-1E. The first metallization layer 20 can be formed after the formation of the passivation layer 24 or the formation of the protective layer 26 in accordance with some embodiments, which will be depicted in FIGS. 2-4. Unless specified otherwise, the reference numerals in these embodiments represent like elements in the embodiments illustrated in FIGS. 1A~1E.

Figure 2A:
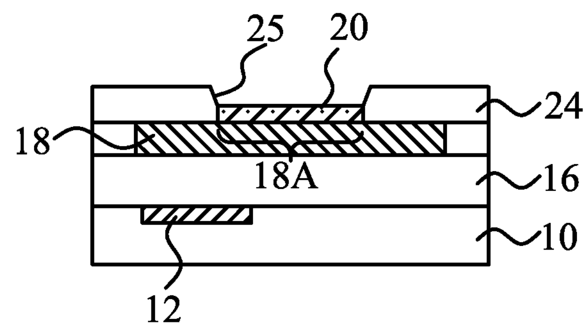
FIGS. 2A and 2B are cross-sectional views illustrating a method of forming a bump structure according to still another embodiment.
Figure 2B:
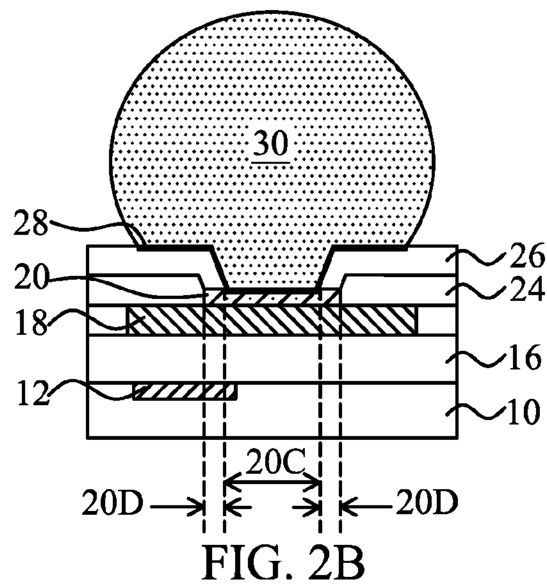

FIGS. 2A and 2B are cross-sectional views illustrating a method of forming a bump structure according to still another embodiment.

Referring to FIG. 2A, the first metallization layer 20 is formed on the exposed pad region 18 after the formation of the passivation layer 24. In some embodiments, the passivation layer 24 is formed on the dielectric layer 16 and the pad region 18 after the formation of the bond pad region 18, and then patterned to have the opening 25 exposing a portion 18A of the pad region 18. Next, the first metallization layer 20 is formed to cap the exposed portion 8A of the pad region 18 by an electroless plating process or an immersion plating process.

With reference to FIG. 2B, the protective layer 26 is formed on the resulted structure to cover the passivation layer 24 and a portion of the first metallization layer 20. In some embodiments, the first metallization layer 20 includes a central portion 20C and a peripheral portion 20D, in which the central portion 20C is exposed by the opening 27 of the protective layer 26, and the peripheral portion 20D is covered by the protective layer 26. Therefore the protective layer 26 lands on the peripheral portion 20D of the first metallization layer 20. Then the second metallization layer 28 and the solder bump 30 are successively formed on the resulted structure to make an electrical contact with the first metallization layer 20 and the pad region 18. This completes a bump structure including the first metallization layer 20 on the pad region 18, in which the first metallization layer 20 is a self-aligned UBM layer within the opening 25 of the passivation layer 24 and partially covered by the protective layer 26.

Figure 3A:
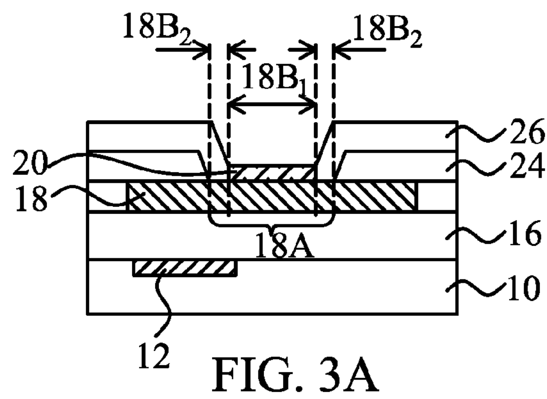
FIGS. 3A and 3B are cross-sectional views illustrating a method of forming a bump structure according to still another embodiment.
Figure 3B:
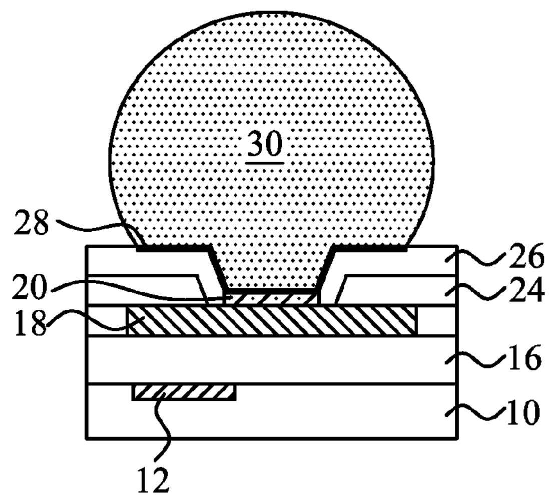

FIGS. 3A and 3B are cross-sectional views illustrating a method of forming a bump structure according to still another embodiment.

Referring to FIG. 3A, the first metallization layer 20 is formed on the exposed pad region 18 after the formation of the passivation layer 24 and the protective layer 26. In some embodiments, the passivation layer 24 is formed on the dielectric layer 16 and the pad region 18 after the formation of the bond pad region 18, and then patterned to have the opening 25 exposing a portion 18A of the pad region 18. The exposed portion 18A of the pad region 18 included a first portion 18$B_1$ and a second portion 18$B_2$. In some embodiments, the first portion 18$B_1$ is the center portion of the exposed portion 18A, and the second portion 18$B_2$ is the peripheral portion of the exposed portion 18A.

Next, the protective layer 26 is formed to cover the passivation layer 24 and the second portion 18$B_2$ of the exposed portion 18A, while the first portion 18$B_1$ of the exposed portion 18A is exposed by the opening 27 (such as shown in FIG. 1D) of the protective layer 26. Therefore the protective layer 26 lands on the second portion 18$B_2$ of the pad region 18. Then the first metallization layer 20 is formed to cap the first portion 18$B_1$ of the pad region 18 by an electroless plating process or an immersion plating process. With reference to FIG. 3B, the second metallization layer 28 and the solder bump 30 are successively formed on the resulted structure to make an electrical contact with the first metallization layer 20 and the pad region 18. This completes a bump structure including the first metallization layer 20 on the pad region 18, in which the first metallization layer 20 is a self-aligned UBM layer within the opening 27 of the protective layer 26.

Figure 4A:
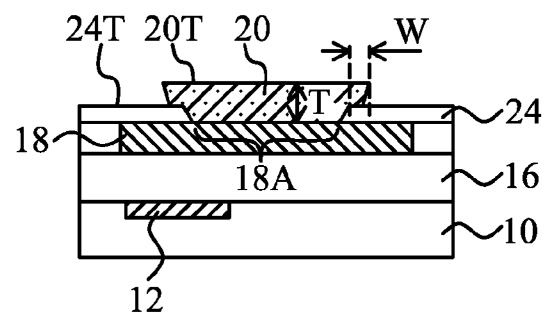
FIGS. 4A to 4C are cross-sectional views illustrating a method of forming a bump structure according to still another embodiment.
Figure 4B:
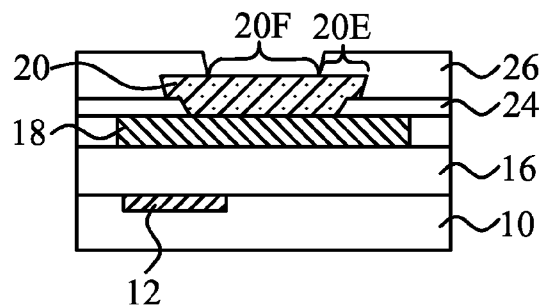
Figure 4C:
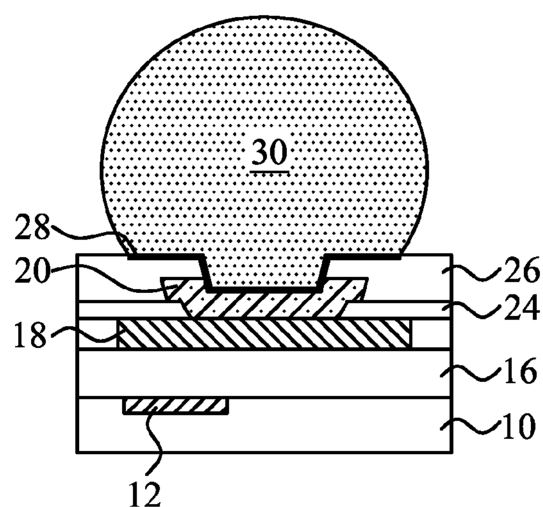

FIGS. 4A-4C are cross-sectional views illustrating a method of forming a bump structure according to still another embodiment.

Referring to FIG. 4A, the first metallization layer 20 is formed on the exposed pad region 18 after the formation of the passivation layer 24, and the first metallization layer 20 has an edge portion 20E extending to the top surface 24T of the passivation layer 24. In some embodiments, the passivation layer 24 is formed on the dielectric layer 16 and the pad region 18 to have the opening 25 exposing the portion 18A of the pad region 18. Next, the first metallization layer 20 is formed to cap the exposed portion 18A of the pad region 18 by an electroless plating process or an immersion plating process. By controlling the time and plating rate of the process, the first metallization layer 20 can be formed to protrude from the top surface 24T of the passivation layer 24, such the top surface 20T of the first metallization layer 20 is higher than the passivation layer 24. The thickness T of the first metallization layer 20 may become greater than 0.3 μm, for example, $0.3 \leq T \leq 10$ μm. In an embodiment, the first metallization layer 20 also includes the edge portion 20E extending to the top surface 24T of the passivation layer 24. The edge portion 20E has a width W greater than or equal to about 2 μm. for example, 2 μm$\leq W \leq$10 μm.

With reference to FIG. 4B, the protective layer 26 is formed on the resulted structure to cover the passivation layer 24 and a portion of the first metallization layer 20, while a portion 20F of the first metallization layer 20 is exposed by the opening 27 of the protective layer 26. In an embodiment, the protective layer 26 covers the edge portion 20E of the first metallization layer 20. Therefore the protective layer 26 lands on the first metallization layer 20.

Then, as shown in FIG. 4C, the second metallization layer 28 and the solder bump 30 are successively formed on the resulted structure to make an electrical contact with the first metallization layer 20 and the pad region 18. This completes a bump structure including the first metallization layer 20 on the pad region 18, in which the first metallization layer 20 is a self-aligned UBM layer sandwiched between the passivation layer 24 and the protective layer 26 and having the edge portion 20E extending to the passivation layer 24.

According to some embodiments, a method of forming a bump structure, including: forming a first metallization layer on a top metal layer of a semiconductor substrate by an electroless plating process or an immersion plating process; forming a passivation layer on the first metallization layer; forming an opening in the passivation layer to expose a portion of the first metallization layer, wherein the exposed portion of the first metallization layer includes a first portion and a second portion; forming a protective layer on the polymer layer and the first metallization layer; forming an opening in the protective layer to expose the first portion of the first metallization layer and cover the second portion of the first metallization layer; and forming a solder bump over the protective layer to electrically connect the first metallization layer.

According to some embodiments, a method of forming a bump structure, including: forming a passivation layer on a top metal layer of a semiconductor substrate; forming an opening in the passivation layer to expose a portion of the top metal layer; forming a first metallization layer on the exposed portion of the top metal layer by an electroless plating process or an immersion plating process; forming a protective layer on the polymer layer and the first metallization layer; forming an opening in the protective layer to expose a first portion of the first metallization layer and cover a second portion of the first metallization layer; and forming a solder bump over the protective layer to electrically connect the first metallization layer.

According to some embodiments, a method of forming a bump structure, including: forming a passivation layer on a top metal layer of a semiconductor substrate; forming an opening in the passivation layer to expose a portion of the top metal layer, wherein the exposed portion of the top metal layer includes a first portion and a second portion; forming a protective layer on the polymer layer and the exposed portion of the top metal layer; forming an opening in the protective layer to expose the first portion of the top metal layer and cover the second portion of the exposed top metal layer; forming a first metallization layer on the first portion of the top metal layer by an electroless plating process or an immersion plating process; and forming a solder bump over the protective layer to electrically connect the first metallization layer.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A method of forming a bump structure, comprising:

forming a passivation layer on a top pad metal region of a semiconductor substrate;

forming an opening in the passivation layer to expose a portion of the top pad metal region;

forming a first metallization layer on the exposed portion of the top pad metal region by a selective plating process, an edge portion of the first metallization layer conforming to and contacting a top surface of the passivation layer, the first metallization layer being formed directly over the top pad metal region and not extending laterally beyond lateral edges of the top pad metal region;

forming a protective layer on the passivation layer and the first metallization layer;

forming an opening in the protective layer to expose a first portion of the first metallization layer while leaving covered a second portion of the first metallization layer;

forming a second metallization layer on the first portion of the first metallization layer and over a top surface of the protective layer; and forming a solder bump over and electrically connected to the second metallization layer.

2. The method of claim 1, wherein the selective plating process is a selective electroless plating process or a selective immersion plating process.

3. The method of claim 1, wherein the protective layer covers the edge portion of the first metallization layer.

4. The method of claim 1, wherein the first metallization layer comprises at least one of a nickel layer, a tin layer, a titanium layer, a palladium layer, or a gold layer.

5. The method of claim 1, wherein the top pad metal region comprises a copper.

6. The method of claim 1, wherein the second metallization layer comprises at least one of a titanium layer, a copper layer or a nickel layer.

7. The method of claim 1, wherein the passivation layer comprises a dielectric layer, and the protective layer comprises a polymer layer.

8. The method of claim 1, wherein the edge portion of the first metallization layer has a first thickness from and in a direction perpendicular to the top surface of the passivation layer, and an inner portion of the first metallization layer has a second thickness from and in a direction perpendicular to a top surface of the top pad metal region at a center of the exposed portion of the top pad metal region, the second thickness being greater than the first thickness.

9. The method of claim 1, wherein the passivation layer on the top pad metal region has a first thickness from and in a direction perpendicular to a top surface of the top pad metal region, and an inner portion of the first metallization layer has a second thickness from and in a direction perpendicular to the top surface of the top pad metal region at a center of the exposed portion of the top pad metal region, the second thickness being greater than the first thickness.

10. A method of forming a bump structure comprising:

forming an interconnect structure comprising a plurality of dielectric layers and associated metallization layers over a substrate;

forming a pad region in a top one of the associated metallization layers;

depositing a passivation layer over and in contact with the pad region;

forming an opening in the passivation layer to expose a portion of the pad region;

selectively plating a first metallization layer on the exposed portion of the pad region, an edge portion of the first metallization layer being over and contacting a top surface of the passivation layer, the first metallization layer not extending laterally beyond edges of the pad region, the edge portion of the first metallization layer having a first thickness from and in a direction perpendicular to the top surface of the passivation layer, an inner portion of the first metallization layer having a second thickness from and in a direction perpendicular to a surface of the exposed portion of the pad region, the second thickness being at a center of the exposed portion of the pad region, the second thickness being greater than the first thickness;

forming a protective layer on the passivation layer and the first metallization layer; and forming an opening in the protective layer to expose a portion of the first metallization layer.

11. The method of claim 10, further comprising forming a solder bump on the exposed portion of the first metallization layer.

12. The method of claim 10, wherein the step of forming the protective layer on the passivation layer and the first metallization layer includes covering the edge portion of the first metallization layer.

13. The method of claim 10, further comprising forming a second metallization layer on the first metallization layer.

14. The method of claim 13, wherein the second metallization layer extends over the protective layer.

15. A method of forming a bump structure comprising:

forming a patterned dielectric layer over and in contact with a top metal layer of a device, the top metal layer including at least one pad region, the patterned dielectric layer covering a portion of the pad region and leaving exposed a portion of the pad region;

forming an under bump metallurgy (UBM) structure on the exposed portion of the pad region, the forming the UBM structure comprising:

forming a first metallization layer on the exposed portion of the pad region by a selective plating process, an edge portion of the first metallization layer extending over and contacting a top surface of the patterned dielectric layer, the first metallization layer being laterally wholly within lateral boundaries of the pad region, and forming a second metallization layer on the first metallization layer;

forming a patterned protective layer on the first metallization layer and on the patterned dielectric layer, the patterned protective layer covering a portion of the first metallization layer and leaving exposed a portion of the first metallization layer, the second metallization layer being formed on the exposed portion of the first metallization layer and over a top surface of the patterned protective layer; and forming a solder bump on the UBM structure.

16. The method of claim 15, wherein forming the first metallization layer comprises:

electroless plating a Ni layer;

electroless plating a Pd layer on the Ni layer; and forming a Au layer on the Pd layer by immersion.

17. The method of claim 15, wherein forming the patterned dielectric layer includes depositing a dielectric layer and forming an opening in the deposited dielectric layer.

18. The method of claim 15, wherein the edge portion of the first metallization layer has a first thickness from and in a direction perpendicular to the top surface of the patterned dielectric layer, and an inner portion of the first metallization layer has a second thickness from and in a direction perpendicular to a top surface of the pad region at a center of the exposed portion of the pad region, the second thickness being greater than the first thickness.

19. A method of forming a bump structure comprising:

forming an interconnect structure comprising dielectric layers and associated metallization layers over a substrate, an uppermost metallization layer of the metallization layers comprising a pad region;

forming a passivation layer over and contacting a first portion of a top surface of the pad region, the passivation layer having a first opening exposing a second portion of the top surface of the pad region, the passivation layer over and contacting the first portion having a first thickness from and in a direction perpendicular to the top surface of the pad region;

selectively plating a first metallization layer over and contacting the second portion of the top surface of the pad region, a first portion of the first metallization layer being at least partially in the first opening and extending above the first opening, the first portion of the first metallization layer having a second thickness at a central region of the pad region and from and in a direction perpendicular to the top surface of the pad region, the second thickness being greater than the first thickness, a second portion of the first metallization layer being over and contacting a top surface of the passivation layer, the second portion of the first metallization layer having a third thickness from and in a direction perpendicular to the top surface of the passivation layer, the second thickness being greater than the third thickness, the first metallization layer not extending laterally beyond lateral edges of the top surface of the pad region;

forming a protective layer over and contacting the passivation layer and the first metallization layer, the protective layer having a second opening exposing the first portion of the first metallization layer;

forming a second metallization layer, a first portion of the second metallization layer being over and contacting the first portion of the first metallization layer and in the second opening, a second portion of the second metallization layer being over and contacting a top surface of the protective layer, the second metallization layer being a conformal layer; and forming a solder bump over and contacting the second metallization layer.

* * * * *